United States Patent
Lee et al.

(10) Patent No.: US 9,406,501 B2
(45) Date of Patent: Aug. 2, 2016

(54) APPARATUS AND METHOD FOR CLEANING SUBSTRATE

(71) Applicant: Semes Co., Ltd., Cheonan-si, Chungcheongnam-do (KR)

(72) Inventors: Yong Hee Lee, Cheongju-si (KR); Bok Kyu Lee, Cheonan-si (KR); Jongsu Choi, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 489 days.

(21) Appl. No.: 13/905,634

(22) Filed: May 30, 2013

(65) Prior Publication Data
US 2013/0319457 A1    Dec. 5, 2013

(30) Foreign Application Priority Data

May 31, 2012   (KR) .................. 10-2012-0058519
Jul. 27, 2012   (KR) .................. 10-2012-0082656

(51) Int. Cl.
*B08B 3/00* (2006.01)
*H01L 21/02* (2006.01)
*H01L 21/67* (2006.01)

(52) U.S. Cl.
CPC .... *H01L 21/02041* (2013.01); *H01L 21/02052* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 2002/0035762 A1* | 3/2002 | Okuda ...................... | B08B 1/04 15/77 |
| 2004/0154641 A1* | 8/2004 | Montierth ................. | B08B 3/08 134/3 |
| 2006/0151006 A1 | 7/2006 | Nam et al. | |
| 2007/0215172 A1 | 9/2007 | Watanabe et al. | |

FOREIGN PATENT DOCUMENTS

| CN | 1965395 A | 5/2007 |
|---|---|---|
| CN | 101359584 A | 2/2009 |
| CN | 101689491 A | 3/2010 |
| JP | 6012187 | 1/1985 |

(Continued)

OTHER PUBLICATIONS

JPO machine translation of JP 2009147293, Retreived from https://www4.j-platpat.inpit.go.jp/eng/tokujitsu/tkbs_en/TKBS_EN_GM301_Detailed.action on Dec. 2, 2015.*

(Continued)

*Primary Examiner* — Eric Golightly
(74) *Attorney, Agent, or Firm* — Harness, Dickey & Pierce, PLC

(57) ABSTRACT

Provided are an apparatus and a method of cleaning a substrate. The apparatus includes a substrate supporting unit supporting a substrate, a container surrounding the substrate supporting unit and collecting an organic solvent scattered from the substrate, and a fluid supplying unit provided on one side of the container and spraying a liquid organic solvent with bubbles to the substrate. The fluid supplying unit includes a nozzle head ejecting the organic solvent to the substrate, an organic solvent supplying line supplying the organic solvent from an organic solvent storage tank to the nozzle head, and a bubble providing element provided on the organic solvent supplying line and providing bubbles to the liquid organic solvent.

15 Claims, 15 Drawing Sheets

(56) References Cited

FOREIGN PATENT DOCUMENTS

| | | |
|---|---|---|
| JP | 2000124179 A | 4/2000 |
| JP | 2007326088 A | 12/2007 |
| JP | 2008041578 A | 2/2008 |
| JP | 2009147293 A | 7/2009 |
| JP | 2009302406 A | 12/2009 |
| JP | 201034388 A | 2/2010 |
| JP | 2010-153475 | 7/2010 |
| JP | 2010-219119 | 9/2010 |
| JP | 2011035133 A | 2/2011 |
| KR | 20-2010-0002861 | 3/2010 |
| KR | 20100032828 A | 3/2010 |
| KR | 20100059352 A | 6/2010 |

OTHER PUBLICATIONS

JPO machine translation of JP 2011035133, retrieved from https://www4.j-platpat.inpit.go.jp/eng/tokujitsu/tkbs_en/TKBS_EN_GM401_Detailed.action on Dec. 8, 2015.*

* cited by examiner

APPARATUS AND METHOD FOR CLEANING SUBSTRATE

CROSS-REFERENCE TO RELATED APPLICATIONS

This U.S. non-provisional patent application claims priority under 35 U.S.C. §119 of Korean Patent Application Nos. 10-2012-0058519, filed on May 31, 2012, and 10-2012-0082656, filed on Jul. 27, 2012, the entire contents of which are hereby incorporated by reference.

BACKGROUND OF THE INVENTION

The present invention relates to an apparatus and a method of manufacturing a semiconductor substrate, and more particularly, to an apparatus and a method of cleaning a substrate.

Generally, semiconductor devices are manufactured through various processes such as a photo process for a substrate like a silicon wafer, an etching process, an ion implantation process, and a deposition process.

And then a cleaning process is performed to remove various pollutants attached to a substrate while performing respective processes. The cleaning process includes a chemical processing process of removing pollutants on a substrate by using chemicals, a wet cleaning process of removing the residual chemicals on the substrate by using pure water, and a drying process for drying residual pure water on a surface of the substrate by supplying a drying fluid.

Typically, the drying process has been performed by supplying a heated nitrogen gas to the substrate on which the pure water is remained. However, as a line width formed on the substrate becomes narrower and an aspect ratio becomes greater, it is difficult to remove the pure water between patterns. For this, recently, the pure water on the substrate is replaced by a liquid organic solvent such as isopropyl alcohol with great volatility and low surface tension and then a heated nitrogen gas is supplied to dry the substrate.

However, since it is difficult to mix a non-polar organic solvent with polar pure water, it is necessary to supply a large amount of the organic solvent for a long time to allow the liquid organic solvent to replace the pure water.

SUMMARY OF THE INVENTION

The present invention provides an apparatus and a method of cleaning a substrate, capable of improving efficiency of drying the substrate.

The present invention also provides an apparatus and a method of cleaning a substrate, capable of saving a liquid organic solvent by allowing replacement between the liquid organic solvent and pure water to be easy.

Embodiments of the present invention provide apparatuses and methods of cleaning a substrate including a substrate supporting unit supporting a substrate, a container surrounding the substrate supporting unit and collecting an organic solvent scattered from the substrate, and a fluid supplying unit provided on one side of the container and spraying a liquid organic solvent with bubbles to the substrate. The fluid supplying unit includes a nozzle head ejecting the organic solvent to the substrate, an organic solvent supplying line supplying the organic solvent from an organic solvent storage tank to the nozzle head, and a bubble providing element provided on the organic solvent supplying line and providing bubbles to the liquid organic solvent.

In some embodiments, the bubble providing element may include a heater provided on the organic solvent supplying line and heating the liquid organic solvent and a controller controlling a temperature of the heater. The controller may control the heater to heat the liquid organic solvent to a temperature of a boiling point or higher.

In other embodiments, the fluid supplying unit may further include a detour line provided on the organic solvent supplying line to make a detour around the heater.

In still other embodiments, isopropyl alcohol may be provided as the organic solvent, and the controller may control the heater to heat the isopropyl alcohol to a temperature from 80° C. to 100° C.

In even other embodiments, the bubble providing element may include an ultrasonic wave applier applying ultrasonic waves to the liquid organic solvent flowing through the organic solvent supplying line.

In yet other embodiments, the ultrasonic wave applier may include a vibration device provided on the organic solvent supplying line and a generator providing the ultrasonic waves to the vibration device.

In further embodiments, the ultrasonic wave applier may further include a bubble amount measurer provided between the vibration device and the nozzle head and measuring an amount of the bubbles included in the liquid organic solvent and a controller controlling a frequency of the ultrasonic waves applied to the vibration device.

In still further embodiments, the vibration device may include a body in contact with the organic solvent supplying line and surrounding the organic solvent supplying line and a vibrator provided inside the body, receiving the ultrasonic waves, and applying the received ultrasonic waves to the organic solvent supplying line.

In even further embodiments, the ultrasonic wave applier may include a container filled with a fluid medium, a vibrator applying vibrations to the fluid medium inside the container, and a generator applying ultrasonic waves to the vibrator. A part of the organic solvent supplying line may be steeped in the fluid medium inside the container.

In yet further embodiments, the bubble providing element may include a membrane line connected to the organic solvent supplying line, in which the liquid organic solvent flows, the membrane line formed with pores, a housing surrounding the membrane line, and a gas supplying line supplying a gas to a space between the membrane line and the housing. The gas supplied to the space may be inserted into the membrane line via the pores, thereby providing bubbles to the liquid organic solvent.

In much further embodiments, the bubble providing element may further include a bubble amount measurer measuring an amount of the bubbles included in the liquid organic solvent, a flux control valve installed on the gas supplying line and controlling flux of the gas supplied to the space, and a controller controlling the flux control valve according to a result of being measured by the bubble amount measurer.

In still much further embodiments, the fluid supplying unit may further include a circulation line branching off from the organic solvent supplying line, connected to the organic solvent storage tank, and transferring the liquid organic solvent to the organic solvent storage tank.

In even much further embodiments, the bubble providing element may be provided on the organic solvent supplying line between a branch point of the circulation line and the nozzle head.

In yet much further embodiments, the fluid supplying unit may further include a degasification element provided on the circulation line and separating bubbles from the circulating liquid organic solvent, and the bubble providing element may be provided on the organic solvent supplying line between the branch point of the circulation line and the organic solvent storage tank.

In further embodiments, the fluid supplying unit may further include a nozzle arm connected to the nozzle head, and the bubble providing element may be provided inside the nozzle arm.

In other embodiments of the present invention, methods of cleaning a substrate.

In some embodiments, the method may include replacing pure water remaining in patterns on the substrate by a liquid organic solvent with bubbles by supplying the liquid organic solvent to the substrate.

In other embodiments, a method of providing bubbles to the liquid organic solvent may include generating the bubbles by heating the liquid organic solvent to a temperature of a boiling point or higher. The organic solvent may be isopropyl alcohol, and the isopropyl alcohol may be heated to a temperature from 80° C. to 100° C., which is a boiling point thereof, thereby providing bubbles to the isopropyl alcohol.

In still other embodiments, a method of providing bubbles to the organic solvent may include applying ultrasonic waves to the organic solvent.

In even other embodiments, a method of providing bubbles to the liquid organic solvent may include transferring a gas to the outside of a membrane line, inserting the gas into the membrane line via pores of the membrane line, and generating the bubbles in the liquid organic solvent passing through the membrane line. The method may further include measuring an amount of bubbles in the liquid organic solvent and controlling an amount of the gas inserted into the organic solvent based on a result of the measuring.

In yet other embodiments, when the organic solvent with bubbles circulates a supplying tank, the method of cleaning the substrate may further include separating the bubbles from the organic solvent.

In further embodiments, when the liquid organic solvent with bubbles remains in patterns of the substrate, the method of cleaning the substrate may further include removing the bubbles by mixing the liquid organic solvent with bubbles with a liquid organic solvent without bubbles ejected to the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
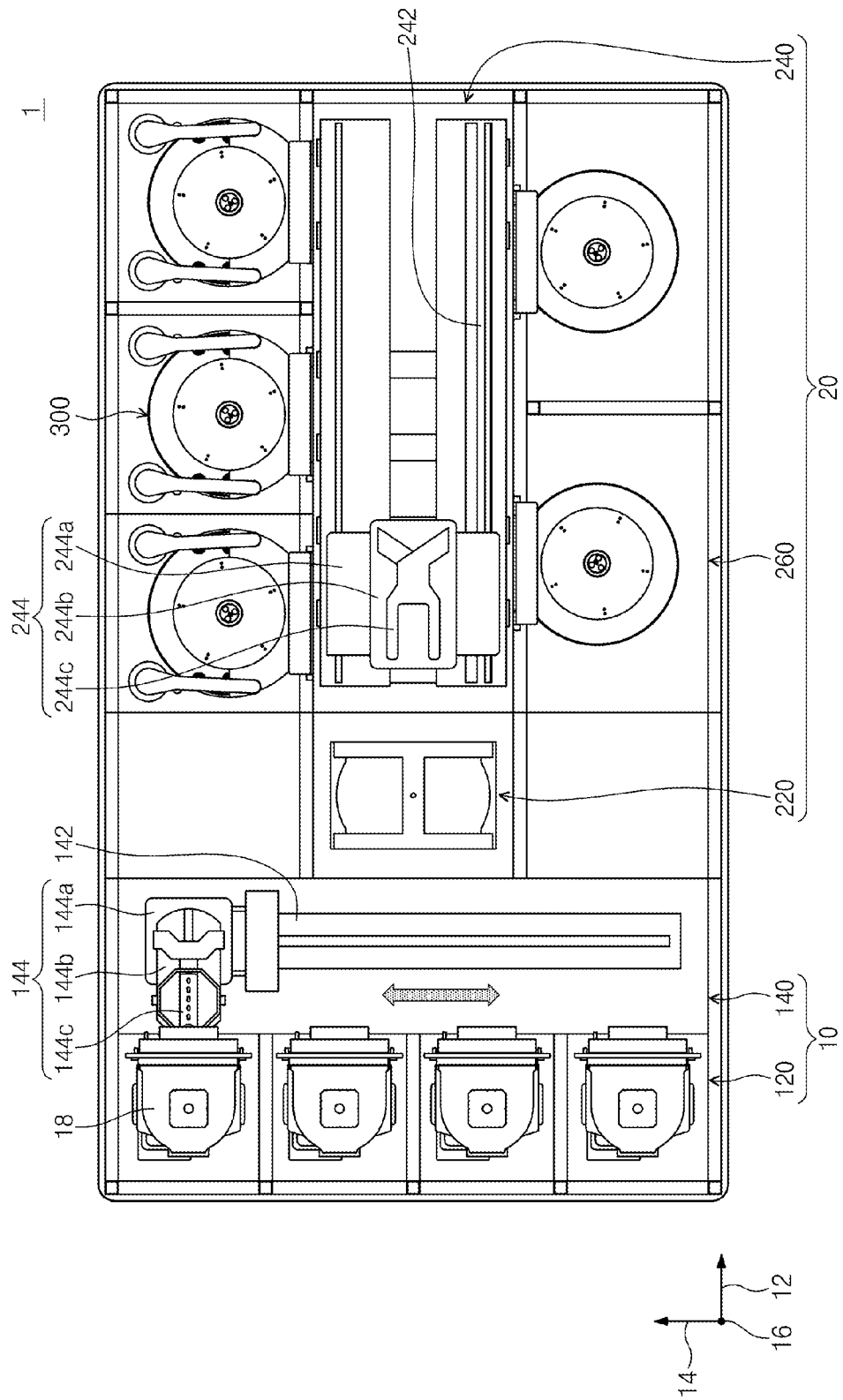
FIG. 1 is a top view illustrating a substrate processing apparatus according to an embodiment of the present invention.

Hereinafter, the embodiments of the present invention will be described in detail with reference to the attached drawings. The embodiments of the present invention may be modified into various forms, and the scope of the present invention is not limited to the following embodiments. The embodiments are provided to perfectly explain the present invention to a person skilled in the art. Accordingly, shapes of elements in the drawings are exaggerated for accurate descriptions.

FIG. 1 is a top view schematically illustrating a substrate processing apparatus according to an embodiment of the present invention.

Referring to FIG. 1, a substrate processing facility 1 includes an index module 10 and a processing module 20. The index module 10 includes a load port 120 and a transfer frame 140. The load port 120, the transfer frame 140, and the processing module 20 are sequentially arranged in a line. Hereinafter, a direction in which the load port 120, the transfer frame 140, and the processing module 20 are arranged is designated as a first direction 12, a direction vertical to the first direction 1 in a top view is designated as a second direction 14, and a direction vertical to a plane including the first direction 12 and the second direction 14 is designated as a third direction 16.

A carrier 18 containing a substrate is seated on the load port 140. The load port 120 is provided in a plurality thereof and arranged in a row along the second direction 14. The number of the load ports 120 may increase or decrease according to processing efficiency and a footprint condition of the processing module 20. A plurality of slots for containing substrates to be level to the ground surface is formed on the carrier 18. As the carrier 18, a front opening unified pod (FOUP) may be used.

The processing module 20 includes a transfer chamber 240, a buffer unit 220, and a processing chamber 260. The transfer chamber 240 is arranged to allow a length direction thereof to be parallel to the first direction 12. The processing chambers 260 are arranged on both sides of the transfer chamber 240. The processing chambers on one side and another side of the transfer chamber 240 are provided to be symmetrical to each other with the transfer chamber 240 as a reference. A plurality of the processing chambers 260 is arranged on the one side of the transfer chamber 240. Some of the processing chambers 260 are arranged along a longitudinal direction of the transfer chamber 240. Also, some of the processing chambers 260 are arranged overlapping one another. That is, the processing chambers 260 may be disposed in an array of A×B on the one side of the transfer chamber 240.

In this case, A is the number of the processing chambers 260 provided in a row along the first direction 12 and B is the number of the processing chambers 260 provided in a row along the second direction 14. When the processing chambers 260 are provided four or six on the one side of the transfer chamber 240, the processing chambers 260 may be arranged in an array of 2×2 or 3×2. The number of the processing chambers 260 may increase or decrease. Different from the described above, the processing chambers 260 may be provided only on the one side of the transfer chamber 240. Different from the described above, the processing chambers 260 may be provided as one story on the one side or the both sides of the transfer chamber 240.

The buffer unit 220 is disposed between the transfer frame 140 and the transfer chamber 240. The buffer unit 220 provides a space between the processing chamber 260 and the carrier 18, in which the substrate stays before transfer. The buffer unit 220 includes a slot in which the substrate is placed, which is provided in a plurality thereof to be separated along the third direction 16. The buffer unit 220 is open at a plane opposite to the transfer frame 140 and a plane opposite to the transfer chamber 240.

The transfer frame 140 transfers the substrate between the carrier 18 seated on the load port 120 and the buffer unit 220. The transfer frame 140 includes an index rail 142 and an index robot 144. The index rail 142 is arranged to allow a longitudinal direction thereof to be parallel to the second direction 14. The index robot 144 is installed on the index rail 142 and straightly moves along the index rail 142 in the second direction 14. The index robot 144 includes a base 144a, a body 144b, and an index arm 144c. The base 144a is installed to be movable along the index rail 142. The body 144b is coupled with the base 144a. The body 144b is provided on the base 144a to be movable along the third direction 16. Also, the body 144b is provided to be rotatable on the base 144a. The index arm 144c is coupled with the body 144b and is provided to be movable forwardly and backwardly with respect to the body 144b. The index arm 144c is provided in a plurality thereof to be individually operated. The index arms 144c are deposited while being separated from one another along the third direction 16. Some of the index arms 144c may be used to transfer the substrate from the processing module 20 to the carrier 18, and other thereof may be used to transfer the substrate from the carrier 18 to the processing module 20. This is for preventing particles generated from the substrate before being processed from being attached to the substrate after being processed during a process in which the index robot 144 carrying the substrate in and out.

The transfer chamber 240 transfers the substrate between the buffer unit 220 and the processing chamber 260 and between the processing chambers 260. The transfer chamber 240 includes a guide rail 242 and a main robot 244. The guide rail 242 is arranged to allow a longitudinal direction thereof to be parallel to the first direction 12. The main robot 244 is installed on the guide rail 242 and straightly moves along the guide rail 142 in the first direction 12. The main robot 244 includes a base 244a, a body 244b and a main arm 244c. The base 244a is installed to be movable along the guide rail 242. The body 244b is coupled with the base 244a. The body 244b is provided on the base 244a to be movable along the third direction 16. Also, the body 244b is provided to be rotatable on the base 244a. The main arm 244c is coupled with the body 244b and is provided to be movable forwardly and backwardly with respect to the body 244b. The main arm 244c is provided in a plurality thereof to be individually operated.

In the processing chamber 260, the substrate cleaning apparatus 300 performing a cleaning process on the substrate is provided. The substrate cleaning apparatus 300 may have different structures according to a type of the cleaning process to be performed. Differently, the substrate cleaning apparatuses 300 in the respective processing chambers 260 may have the same structure. Selectively, the processing chambers 260 are classified into a plurality of groups in such a way that the substrate cleaning apparatuses 300 in the processing chambers 260 included in the same group may be the same but structures of the substrate cleaning apparatuses 300 in the chambers 260 included in the different groups may be provided to be different from one another. For example, when the processing chambers 260 are classified into two groups, the processing chambers 260 of a first group may be provided on the one side of the transfer chamber 240 and the processing chambers 260 of a second group may be provided on the other side of the transfer chamber 240. Selectively, on both sides of the transfer chamber 240, the processing chambers 260 of the first group may be provided on a lower story and the processing chambers 260 of the second group may be provided on an upper story. The processing chambers 260 of the first group and the processing chambers 260 of the second group may be classified according to the type of chemicals to be used or the type of a cleaning method, respectively. Differently, the processing chambers 260 of the first group and the processing chambers 260 of the second group may be provided to sequentially perform processes on one substrate W.

An example of the substrate cleaning apparatus 300 cleaning the substrate W by using chemicals will be described as follows.

Figure 2:
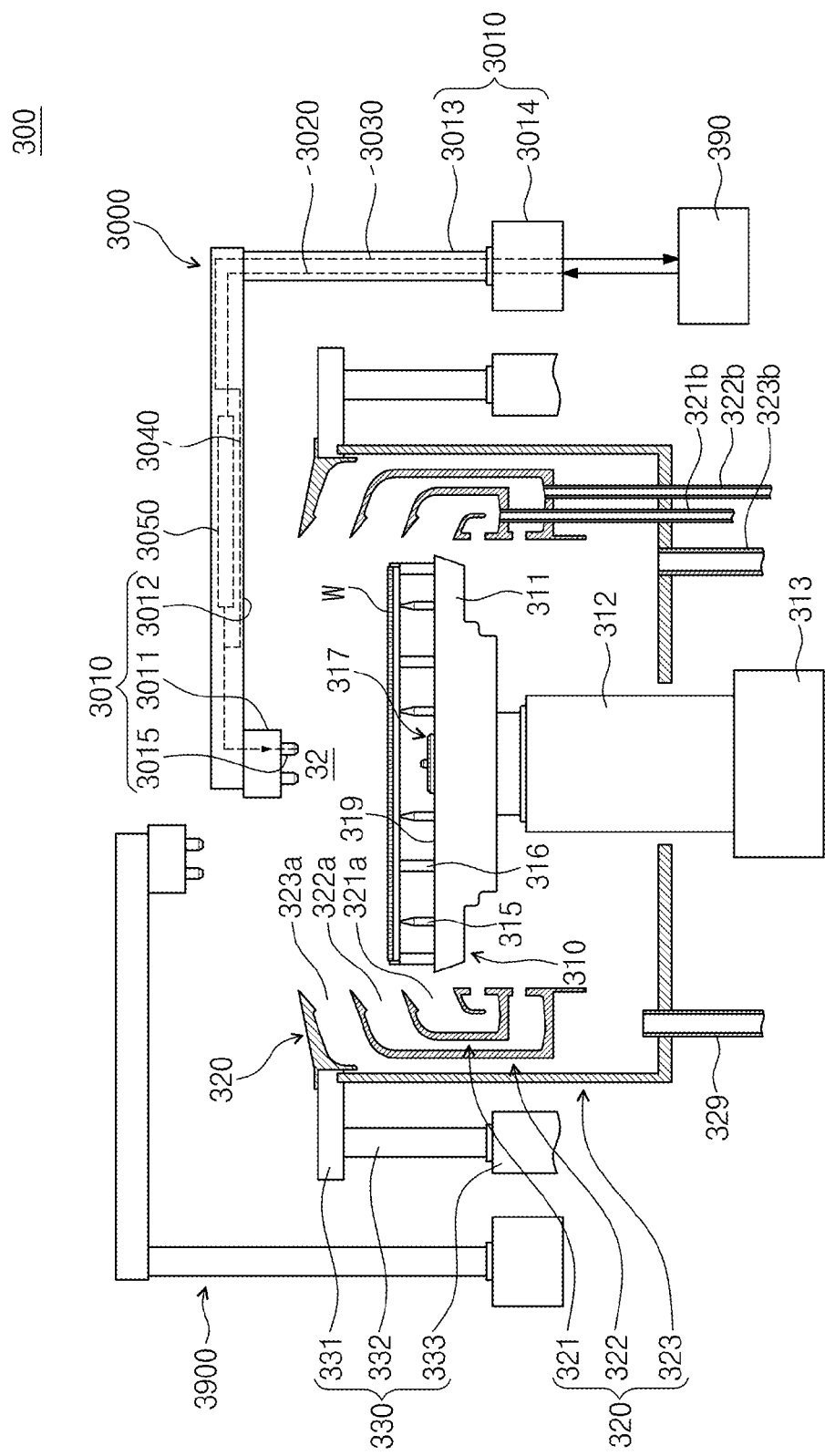
FIG. 2 is a cross-sectional view illustrating the substrate cleaning apparatus of FIG. 1.

FIG. 2 is a cross-sectional view illustrating the substrate cleaning apparatus 300.

Referring to FIG. 2, the substrate cleaning apparatus 300 includes a substrate supporting unit 310, a container 320, an elevation unit 330, and fluid supplying units 3000 and 3900.

The substrate supporting unit 310 supports the substrate W during a cleaning process. The substrate supporting unit 310 includes a spin head 311, a spindle 312, and a rotation element 313.

The spin head 311 is disposed in an inner space of the container 320. The spin head 311 includes a top surface 319 on which the substrate W is loaded. The top surface 319 is provided with supporting pins 315 protruded upwardly therefrom. The supporting pins 315 supports an edge of a rear of the substrate W to be separated from the top surface 319 of the spin head 311 with a certain interval. A chucking pin 316 is provided in an edge of a top surface of the substrate W. The chucking pin 316 supports a side of the substrate W not to be separated laterally from a precise location while spin head 311 is rotating.

The spindle 312 is coupled with the center of a bottom of the spin head 311. The spindle 312 is a hollow shaft whose inside is hollow. The spindle 312 transfers a rotational force of the rotation element 313 to the spin head 311. Not shown in detail, the rotation element 313 may generally include a driver such as a motor generating a rotational force and a power transfer part such as a belt and a chain transferring the rotational force generated by the driver to the spindle 312.

On the other hand, a back nozzle part 317 is installed on the spin head 311. The back nozzle part 317 sprays a fluid such as ultra-pure water and a nitrogen gas to a bottom of the substrate W. The back nozzle part 317 is located in the center of the spin head 311.

Referring to FIG. 2, the container surrounds the spin head 311 and has an open top. The container 320 has a configuration available for separating and collecting chemicals used in the processes. This allows reuse of the chemicals. The container 320 includes a plurality of collecting tanks 3210, 3220, and 3230. The respective collecting tanks 3210, 3220, and 3230 collect different kinds of chemicals used in the processes, respectively. In the present embodiment, the container 320 includes three collecting tanks 3210, 3220, and 3230. The respective collecting tanks are designated as an inner collecting tank 3210, an intermediate collecting tank 3220, and an outer collecting tank 3230.

The inner collecting tank 321 is provided as a ring shape surrounding the spin head 311. The intermediate collecting tank 322 is provided as a ring shape surrounding the inner collecting tank 321. The outer collecting tank 323 is provided as a ring shape surrounding the intermediate collecting tank 322. The respective collecting tanks 321, 322, and 323 include inlets 321a, 322a, and 323a connected to a space inside the container 320, respectively. The respective inlets 321a, 322a, and 323a are provided as ring shapes around the spin head 311. The chemicals used in the processes while being sprayed to the substrate W flow into the collecting tanks 321, 322, and 323 through the inlets 321a, 322a, and 323a due to a centrifugal force caused by rotation of the substrate W. The inlet 323a of the outer collecting tank 323 is provided vertically above the inlet 322a of the intermediate collecting tank 322, and the inlet 322a of the intermediate collecting tank 322 is provided vertically above the inlet 321a of the inner collecting tank 321. That is, the inlets 321a, 322a, and 323a of the inner collecting tank 321, the intermediate collecting tank 322, and the outer collecting tank 323 are provided in such a way that heights thereof are different from one another.

The inner collecting tank 321, the intermediate collecting tank 322, and the outer collecting tank 323 are coupled with discharge pipes 321b, 322b, and 323b discharging the chemicals and a vent pipe 329 discharging gases including fumes.

The elevation unit 330 straightly transfers the container 320 in a vertical direction. As the container 320 is vertically transferred, a height of the container 320 relative to the spin head 311 is changed. The elevation unit 330 includes a bracket 331, a transfer shaft 332, and a driver 333. The bracket 331 is fastened to an outer wall of the container 320, and the transfer shaft 332 vertically transferred by the driver 333 is fastened to and coupled with the bracket 331. When the substrate W is placed on the spin head 311 or lifted from the spin head 311, the container 320 descends to allow the spin head 311 to be protruded upwardly from the container 320. Also, while performing the processes, according to the kind of the chemicals supplied to the substrate W, the height of the container 320 is controlled to allow the chemicals to flow into the collecting tanks 321, 322, and 323. Different from the described above, the elevation unit 330 may transfer the spin head 311 in a vertical direction.

The fluid supplying units 3000 and 3900 supply chemicals, a cleaning solution, an organic solvent, and a drying gas, which are needed for a substrate cleaning process, to the substrate W. The fluid supplying units 3000 and 3900 include, according to a supplied fluid, a chemical supplying unit, a cleaning solution supplying unit, an organic solvent supplying unit 3000, and a drying gas supplying unit 3900. Referring to FIG. 2, the organic solvent supplying unit 3000 is disposed on one side of the container 320 and the drying gas supplying unit 3900 is disposed on another side of the container 320. Selectively, an organic solvent and a drying gas may be supplied by a single supplying unit. Not shown in the drawings, the chemical supplying unit and the cleaning solution supplying unit may be provided in one side surface of the container, together with the organic solvent supplying unit 3000 and the drying gas supplying unit 3900 in one chamber.

The organic solvent supplying unit 3000 sprays a liquid type organic solvent to a top surface of the substrate W to dry the substrate W. The liquid type organic solvent provided to the substrate W replaces pure water remaining on the surface of the substrate W after the cleaning process. After that, the organic solvent is volatilized by the rotation of the substrate W, a drying gas, or heating. Initially, the liquid type organic solvent is supplied to the substrate W while including bubbles in such a way that efficiency of replacing the pure water remaining on the surface of the substrate W is improved. After that, the liquid type organic solvent with no bubbles is supplied to the substrate W, thereby removing bubbles in patterns of the substrate W. As the liquid type organic solvent, isopropyl alcohol may be provided.

The organic solvent supplying unit 3000 includes a nozzle element 3010, an organic solvent supplying line 3020, a collecting line 3030, a detour line 3040, and a bubble providing element 3050.

The nozzle element 3010 includes a nozzle head 3011, a nozzle arm 3012, a supporting shaft 3013, and a driver 3014.

The supporting shaft 3013 is located on the outside of the container 320. The supporting shaft 3013 is disposed in such a way that a longitudinal direction thereof becomes vertical. The supporting shaft 3013 is coupled with the driver 3014 and rotated by the driver with respect to a central axis thereof. Also, the supporting shaft 3013 is vertically transferred by the driver 3014. The nozzle arm 3012 is mounted on a top end of the supporting shaft 3013. The nozzle arm 3012 is disposed to be vertical to the supporting shaft 3013. The nozzle head 3011 is mounted on an end of the nozzle arm 3012. The nozzle head 3011 has an injection nozzle 3015. The injection nozzle 3015 is connected to the organic solvent supplying line 3020 and sprays a liquid organic solvent to the substrate W. The nozzle head 3011 is swung between a central area and an edge area of the substrate W by rotation of the supporting shaft 3013.

Figure 3:
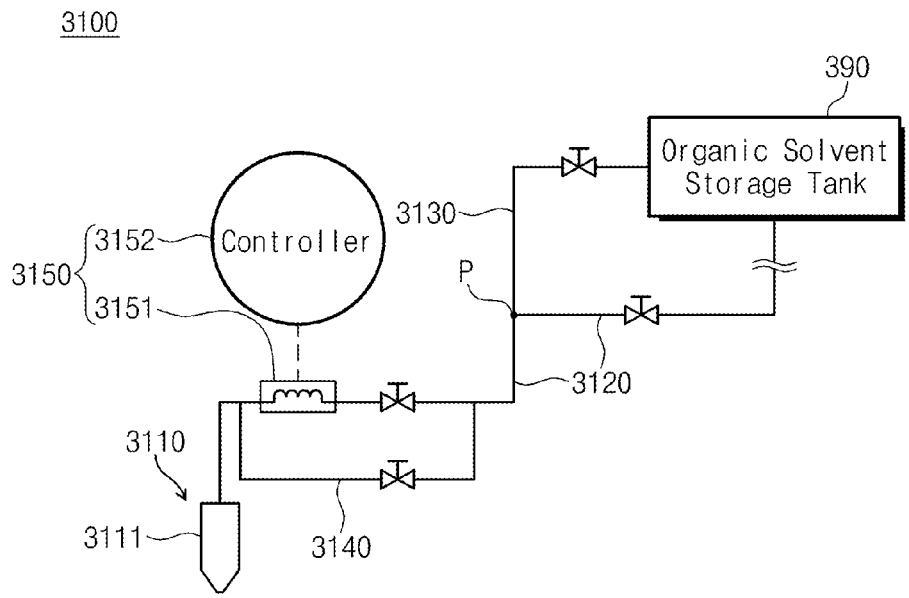
FIG. 3 is a view illustrating an organic solvent supplying unit according to an embodiment of the present invention.

Hereinafter, an organic solvent supplying unit 3100 according to an embodiment of the present invention will be described. FIG. 3 is a view illustrating the organic solvent supplying unit 3100.

Referring to FIG. 3, the organic solvent supplying unit 3100 includes a nozzle element 3110, an organic solvent supplying line 3120, a collecting line 3130, a detour line 3140, and a bubble providing element 3150.

The organic solvent supplying line 3120 connects an organic solvent storage tank 390 and a nozzle head 3111 to each other. The collecting line 3130 branches off from the organic solvent supplying line 3120 and is connected to the organic solvent storage tank 390. Hereinafter, a point where the collecting line 3130 branches off from the organic solvent supplying line 3120 is designated as a branch point P. A liquid organic solvent stored in the organic solvent storage tank 390 is supplied to the nozzle head 3111 through the organic solvent supplying line 3120 or is collected to the organic solvent storage tank 390 through the collecting line 3130. According to an example, a part of the organic solvent supplying line 3120 may be located on the nozzle arm 3112 and the bubble providing element 3150 may be located inside the nozzle arm 3112. Selectively, the bubble providing element 3150 may be located outside the nozzle arm 3112.

The bubble providing element 3150 includes a heater 3151 and a controller 3152. According to an example, the heater 3151 is installed on the organic solvent supplying line 3120 between the nozzle head 3111 and the branch point P. The heater 3151 heats the liquid organic solvent to generate bubbles inside the liquid organic solvent. The controller 3152 controls a temperature of heating the liquid organic solvent by the heater 3151.

According to an example, the liquid type organic solvent may be isopropyl alcohol. The controller 3152 controls to allow the isopropyl alcohol to be heated to 80 to 100° C. to include bubbles while being a liquid. The isopropyl alcohol has a boiling point of 80° C. and is generally vaporized at a temperature of 100° C. or more. Accordingly, to supply liquid type isopropyl alcohol including bubbles by heating, the isopropyl alcohol is heated at a temperature from 80 to 100° C.

The detour line 3140 is connected to the organic solvent supplying line 3120. According to an example, the detour line 3140 branches off from the organic solvent supplying line 3120 at an upper stream than the bubble providing element 3150 and is connected to the organic solvent supplying line 3120 at a lower stream than the bubble providing element 3150. The detour line 3140 allows the liquid organic solvent to make a detour around the bubble providing element 3150 and to be supplied to the nozzle head 3111. According to an example, in initial drying, the liquid organic solvent may pass through the heater 3151 and then may be supplied to the substrate W while including bubbles. In a latter part of drying, the liquid organic solvent may make a detour around the heater 3151 and may be supplied to the substrate W while not including bubbles. When the detour line 3140 is not provided, to supply an organic solvent without bubbles, it is necessary to wait till a temperature of the heater 3151 decreases to a certain degree or less or to additionally provide another organic solvent supplying unit. However, in the present embodiment, since the liquid organic solvent may pass through the detour line 3140 to be directly supplied while being without bubbles to the nozzle head 3111, it is possible to reduce a processing time with no additional organic solvent supplying unit.

The liquid organic solvent replaces pure water remaining on the substrate W. Since having more excellent volatility than that of the pure water, the liquid organic solvent may be easily removed from the substrate W. However, since polar pure water is not well mixed with a non-polar liquid organic solvent, replacement is not easy.

Figure 4:
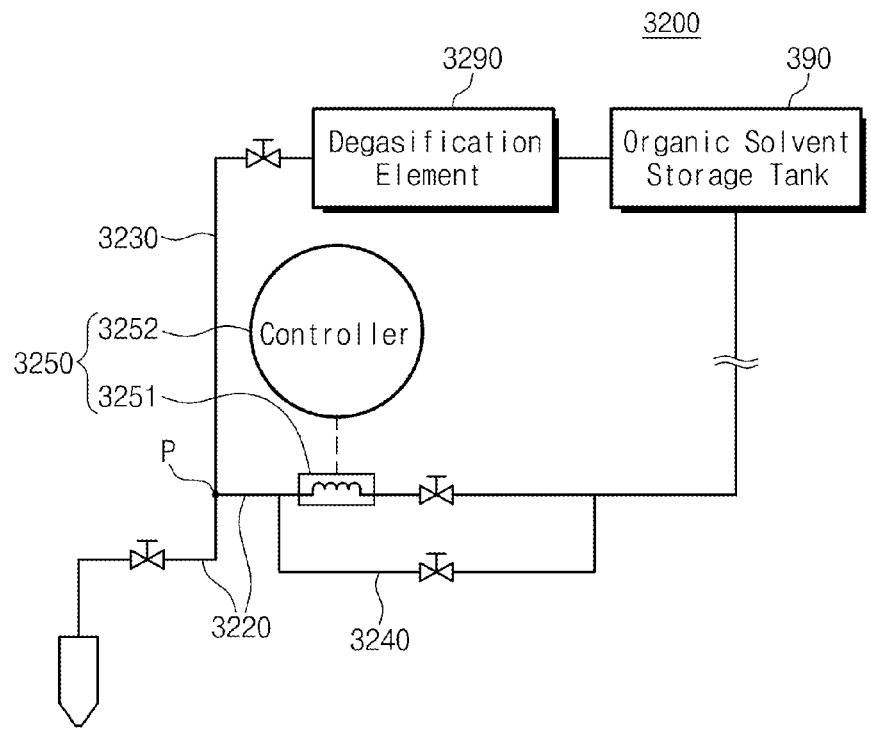
FIG. 4 is a view illustrating a modified example of the organic solvent supplying unit of FIG. 3.

FIG. 4 is a view illustrating a modified example of the organic solvent supplying unit 3100.

Referring to FIG. 4, a bubble providing element 3250 of an organic solvent supplying unit 3200 is provided on an organic solvent supplying line 3220 between a branch point P of a collecting line 3230 and the organic solvent storage tank 390. In this case, the organic solvent supplying unit 3200 further includes a degasification element 3290. The degasification element 3290 is provided on the collecting line 3230. As a liquid organic solvent passes through the bubble providing element 3250, bubbles are generated therein. When being not sprayed to the substrate W, the liquid organic solvent is transferred through the collecting line 3230 and is degasified at the degasification element 3290.

In the described above, the detour lines 3140 and 3240 and the collecting lines 3130 and 3230 are connected to the organic solvent supplying lines 3120 and 3220. However, at least one of the detour lines 3140 and 3240 and the collecting lines 3130 and 3230 may not be provided.

Hereinafter, a method of cleaning a substrate by using a substrate cleaning apparatus according to an embodiment of the present invention will be described.

The method of cleaning the substrate may be performed by using another substrate cleaning apparatus performing the same or similar functions as those of the substrate cleaning apparatus according to the embodiments of the present invention.

Figure 5:
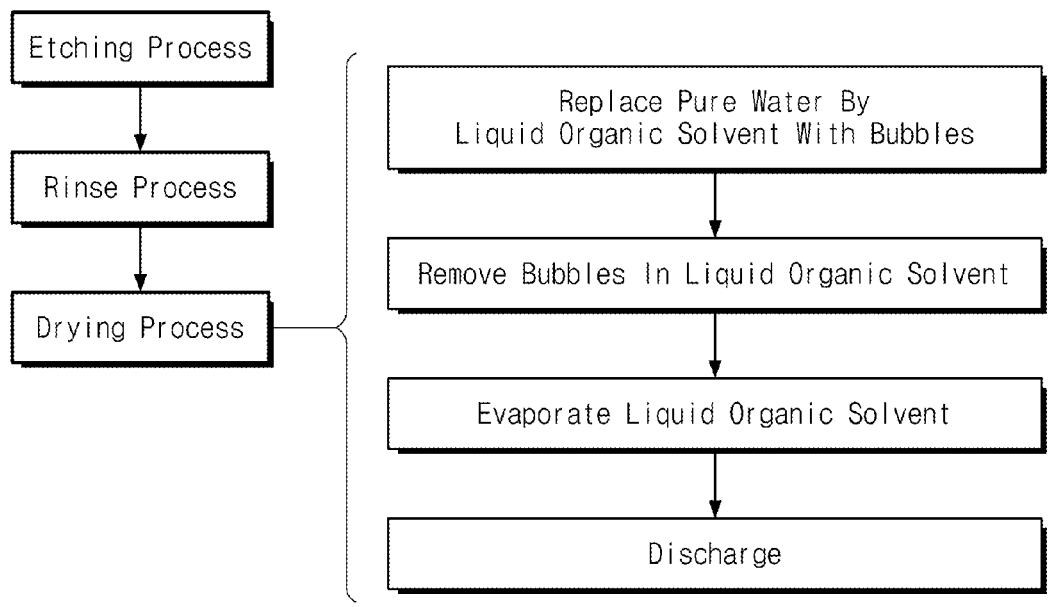
FIG. 5 is a flowchart illustrating a method of cleaning a substrate by using the substrate cleaning apparatus of FIG. 1.

FIG. 5 is a flowchart illustrating a method of cleaning a substrate by using the substrate cleaning apparatus 300 of FIG. 1.

Referring to FIG. 5, the method includes an etching process of forming a circuit pattern by selectively removing a thin film by using chemicals, a rinse process of removing the chemicals by using pure water, and a drying process of drying the pure water remaining on the substrate by using an organic solvent. A substrate drying method according to an embodiment of the present invention includes replacing pure water remaining on a substrate by a liquid organic solvent including bubbles. After that, the liquid organic solvent including the bubbles on the substrate is replaced by a liquid organic solvent without bubbles. The liquid organic solvent without bubbles is volatilized from the substrate. In this case, to easily volatilize the liquid organic solvent, the substrate may be rotated or heated or a nonvolatile gas may be supplied thereto.

Hereinafter, a process of performing the drying will be described with reference to FIGS. 6 to 11. While performing a cleaning process on a substrate, a liquid organic solvent is not supplied to a nozzle head but circulates.

Figure 6:
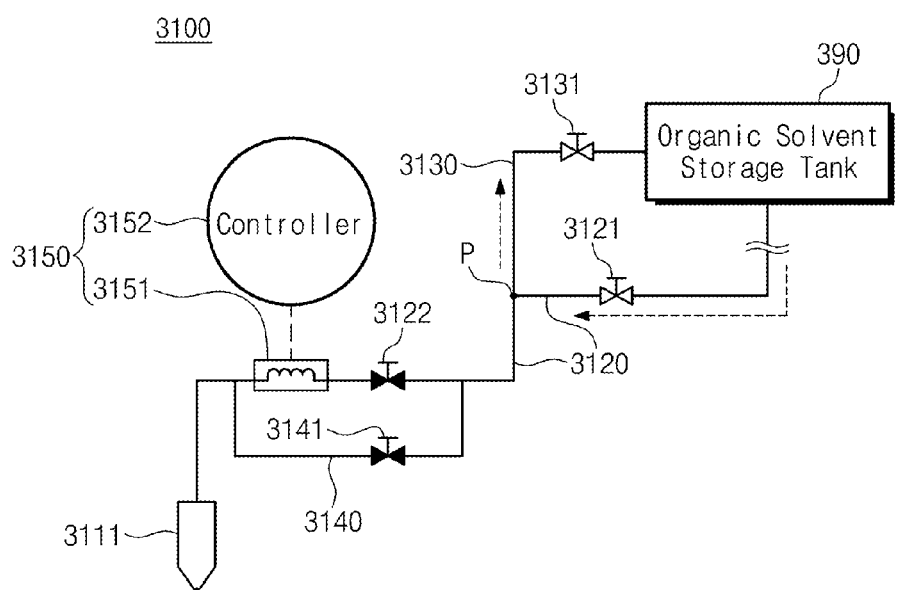
FIG. 6 is a view illustrating a circulation pathway of a liquid organic solvent by using the organic solvent supplying unit of FIG. 3.

FIG. 6 is a view illustrating a circulation pathway of the liquid organic solvent by using the organic solvent supplying unit 3100 of FIG. 3.

Referring to FIG. 6, while performing the cleaning process on the substrate, a valve 3122 on the organic solvent supplying line 3120 and a valve 3141 on the detour line 3140 are closed and a valve 3131 on the circulation pathway 3130 is opened in the organic solvent supplying unit 3100. In this case, a liquid organic solvent is not sprayed to the substrate. Due to this, the liquid organic solvent is not transferred to the nozzle head 3111 but is collected to the organic solvent storage tank 390.

Figure 7:
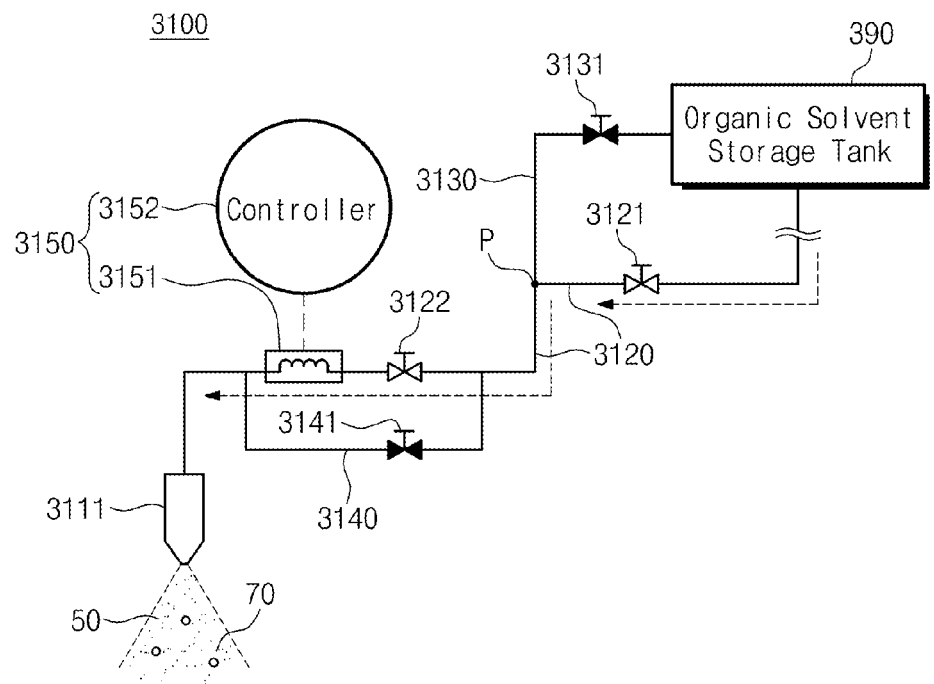
FIG. 7 is a view illustrating a process of spraying the liquid organic solvent with bubbles to the substrate by using the organic solvent supplying unit of FIG. 3.

FIG. 7 is a view illustrating a process of spraying a liquid organic solvent 50 with bubbles to the substrate by using the organic solvent supplying unit 3100 of FIG. 3.

Referring to FIG. 7, when pure water remains on the substrate after performing the cleaning process, the valve 3122 on the organic solvent supplying line 3120 is opened and the valve 3131 on the circulation pathway 3130 and the valve 3141 on the detour line 3140 are closed in the organic solvent supplying unit 3100. The liquid organic solvent 50 is transferred to the heater 3151 through the organic solvent supplying line 3120. While passing through the heater 3151, the liquid organic solvent 50 is heated to a temperature higher than a boiling point. Bubbles 70 are generated in the heated liquid organic solvent 50. The liquid organic solvent 50 with the bubbles 70 is transferred to the nozzle head 3111 through the organic solvent supplying line 3120 and is sprayed to the substrate from an injection nozzle 3115.

Figure 8:
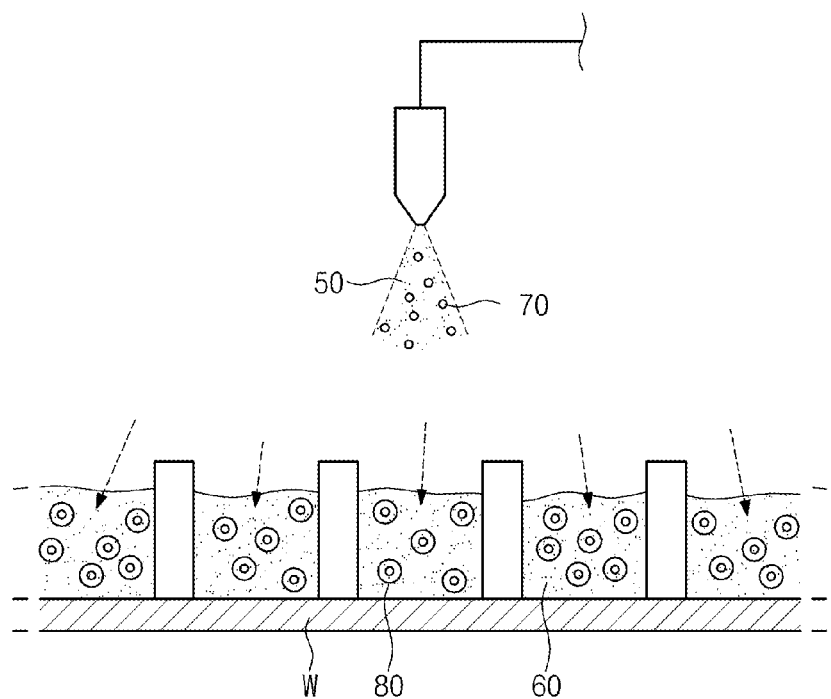
FIG. 8 is a view illustrating a process in which the liquid organic solvent with bubbles of FIG. 7 replaces the pure water on the substrate.

FIG. 8 is a view illustrating a process in which the liquid organic solvent 50 with bubbles 70 of FIG. 7 replaces the pure water on the substrate.

Referring to FIG. 8, the liquid organic solvent 50 including the bubbles 70 sprayed to the substrate W becomes in contact with pure water 60 remaining on the substrate W. In this case, the bubbles 70 included in the liquid organic solvent 50 are transferred into the pure water 60 together with the liquid organic solvent 50. In this process, the bubbles 70 and the liquid organic solvent 50 are contact with the pure water 60. On a contact surface thereof, three-phase boundary 80 of the liquid organic solvent 50, the pure water 60 and a gas are generated. On the substrate W, when the liquid organic solvent 50 and the pure water 60 are in contact with each other, a plurality of three-phase boundary 80 may be generated for the respective bubbles 70 included in the liquid organic solvent 50. An eddy 90 occurs at the three-phase boundary 80. Due to the eddy 90, replacement between the liquid organic solvent 50 and the pure water 60 is easily performed.

Figure 9:
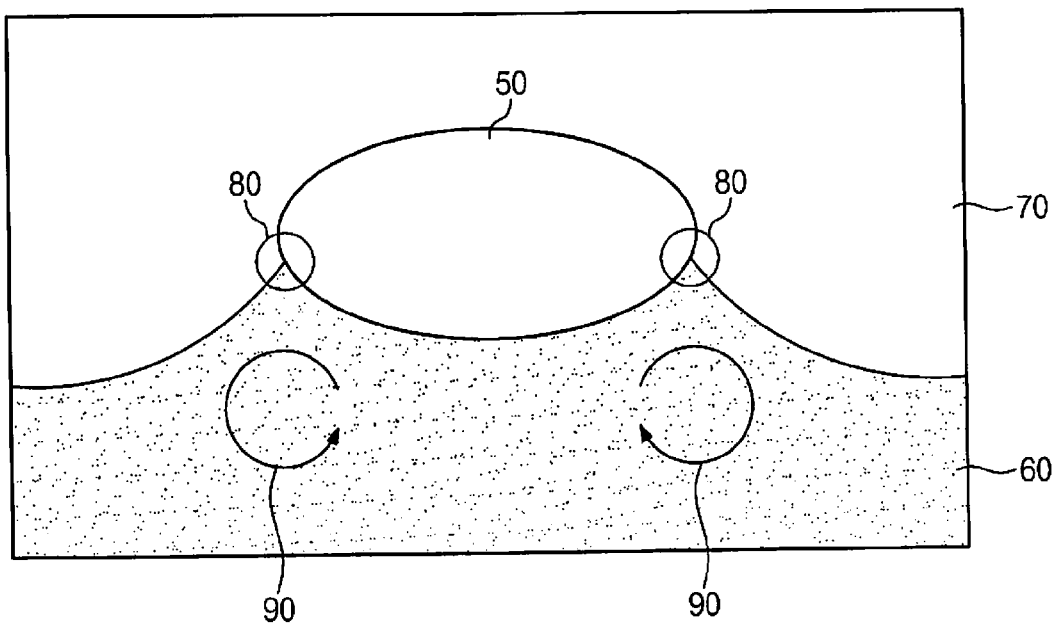
FIG. 9 is a view illustrating a process in which eddies occur at three-phase boundary of the liquid organic solvent, the pure water, and a gas.

FIG. 9 is a view illustrating a process in which the eddy 90 occurs at three-phase boundary of the liquid organic solvent 50, the pure water 60, and the gas.

Referring to FIG. 9, the eddy 90 occurs at for each three-phase boundary 80 of the liquid 50, the pure water 60, and the gas 70. This is because surface tensions of the liquid organic solvent 50, the pure water 60, and the gas 70 are different from one another. The eddy 90 stimulates movement between the liquid organic solvent 50 and the pure water 60, thereby easily performing the replacement between the liquid organic solvent 50 and the pure water 60.

The liquid organic solvent 50 replaces the pure water 60 remaining on a substrate. The liquid organic solvent 50 replacing the pure water 60 and remaining on the substrate has more excellent volatility than that of the pure water 60 to be easily volatilized from the substrate. However, the polar pure water 60 and the non-polar liquid organic solvent 50 are not mixed well. Also, replacement is well performed due to a gas on a surface of the pure water 60 remaining on the substrate. However, when only the pure water 60 remains inside patterns, since there is no gas, the replacement is not performed well. Accordingly, a time for the replacement between the pure water 60 and the liquid organic solvent 50 increases and a consumption amount of the liquid organic solvent is great.

In the present embodiment, due to the eddy 90 occurring at the three-phase boundary 80 of the liquid organic solvent 50, the pure water 60, and the gas 70 in the pure water 60, the replacement between the pure water 60 and the liquid organic solvent 50 is easily performed. Due to this, the time for the replacement decreases, thereby reducing a time for drying the substrate. Also, an amount of the liquid organic solvent 50 used for drying the substrate may be reduced. Through this, efficiency of drying the substrate is improved.

Figure 10:
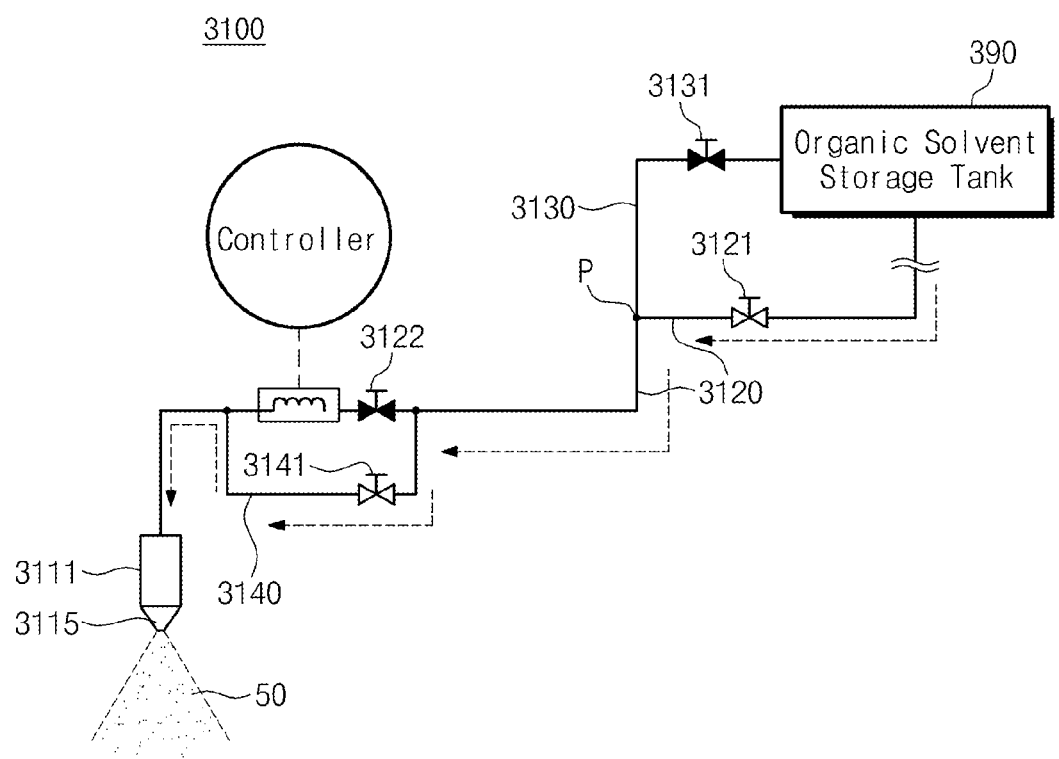
FIG. 10 is a view illustrating a process of spraying the liquid organic solvent with no bubbles to the substrate by using the organic solvent supplying unit of FIG. 3.
Figure 11:
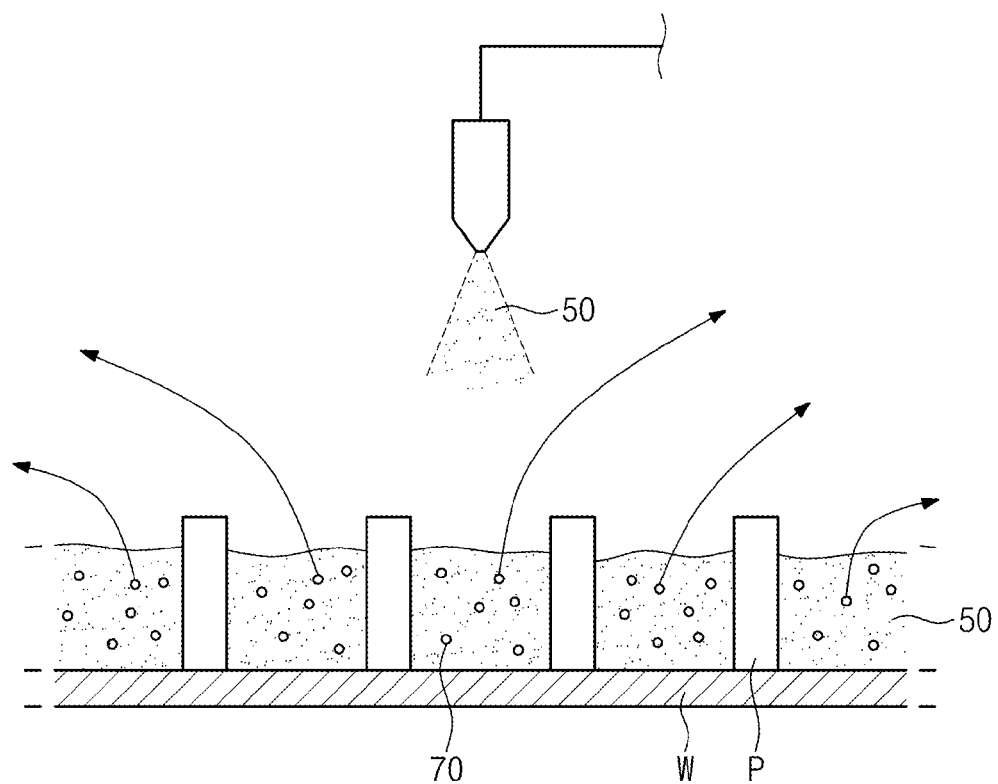
FIG. 11 is a view illustrating a process of removing the bubbles from the liquid organic solvent of FIG. 10.

Next, a liquid organic solvent without bubbles is supplied from a nozzle head to a substrate. FIG. 10 is a view illustrating a process of spraying the liquid organic solvent without bubbles to the substrate by using the organic solvent supplying unit 3100 of FIG. 3. FIG. 11 is a view illustrating a process of removing the bubbles from the liquid organic solvent of FIG. 10.

Referring to FIGS. 10 and 11, when the liquid organic solvent 50 including the bubbles 70 remains on the substrate W, the valve 3122 on the organic solvent supplying line 3120 and the valve 3131 on the collecting line 3130 are closed and the valve 3141 on the detour line 3140 is opened. The liquid organic solvent 50 is transferred to the injection nozzle 3115 of the nozzle head 3111 through the detour line 3140. The liquid organic solvent 50 without the bubbles 70 is sprayed from the injection nozzle 3115 to a top of the substrate W. The liquid organic solvent 50 without the bubbles 70 is sprayed toward the substrate W in such a way that the liquid organic solvent 50 including the bubbles 70 remaining on the substrate W is discharged outside the substrate W. When the liquid organic solvent 50 with the bubbles 70 remains on the substrate W, the bubbles 70 may burst between patterns p on the top of the substrate W and then the patterns p may be damaged. However, in the present embodiment, the bubbles 70 are removed from the liquid organic solvent 50 on the substrate W, thereby preventing the damage of the patterns p.

In the present embodiment described above, the detour line 3140 and the collecting line 3130 are connected to the organic solvent supplying line 3120. However, at least one of the detour line 3140 and the collecting line 3130 may not be provided.

Also, an operation of providing the liquid organic solvent without bubbles in FIGS. 10 and 11 may not be performed.

Figure 12:
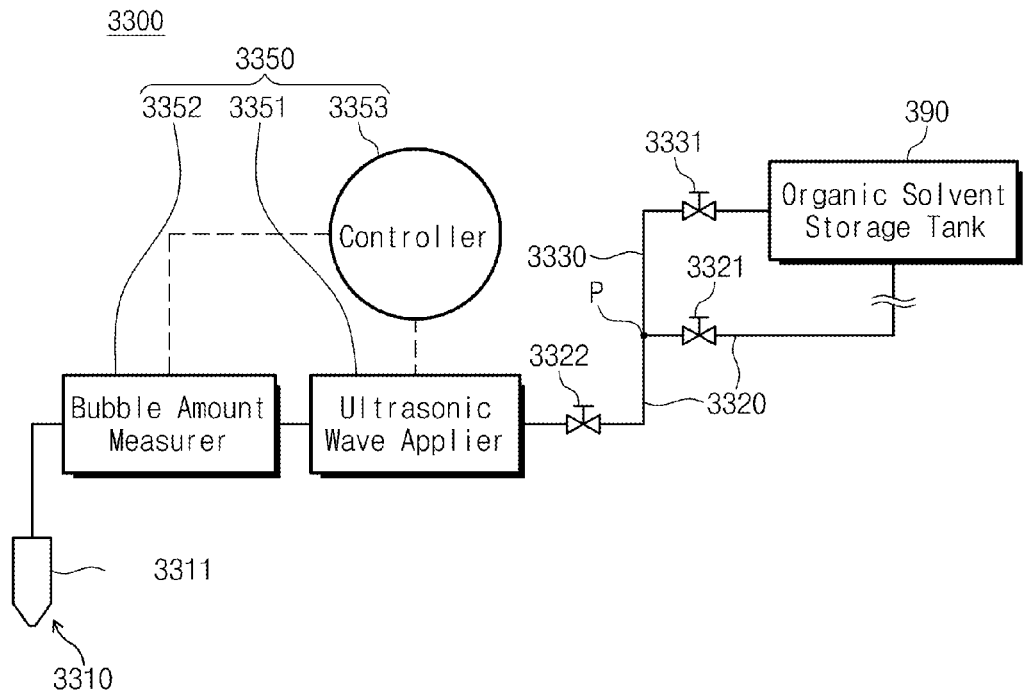
FIG. 12 is a view illustrating an organic solvent supplying unit according to another embodiment of the present invention.

Hereinafter, an organic solvent supplying unit 3300 according to another embodiment of the present invention will be described. FIG. 12 is a view illustrating the organic solvent supplying unit 3300.

Referring to FIG. 12, the organic solvent supplying unit 3300 includes a nozzle element 3310, an organic solvent supplying line 3320, a collecting line 3330, and a bubble providing element 3350.

The nozzle element 3310, the organic solvent supplying line 3320, and the collecting line 3330 may have similar configurations to those of the nozzle element 3110, the organic solvent supplying line 3120, and the collecting line 3130.

The bubble providing element 3350 includes an ultrasonic wave applier 3351, a bubble amount measurer 3352, and a controller 3353. The ultrasonic wave applier 3351 is provided on the organic solvent supplying line 3320. The ultrasonic wave applier 3351 applies ultrasonic waves to a liquid organic solvent to generate bubbles inside the liquid organic solvent. The bubble amount measurer 3352 is provided between the ultrasonic wave applier 3351 and a nozzle head 3311 on the organic solvent supplying line 3320. The bubble amount measurer 3352 measures an amount of bubbles inside the liquid organic solvent and provides a measured value thereof to the controller 3353. The controller 3353 receives the measured value from the bubble amount measurer 3352 and controls a frequency for generating ultrasonic waves at the ultrasonic wave applier 3351 based on the measured value. Through this, the amount of the bubbles generated in the liquid organic solvent may be controlled. According to an example, the controller 3353 controls the ultrasonic wave applier 3351 to apply a frequency within a range from 1 to 2 MHz. When providing bubbles generated in the liquid organic solvent by applying ultrasonic waves generated by the frequency within the range from 1 to 2 MHz, replacement between the liquid organic solvent and pure water is most effective.

Figure 13:
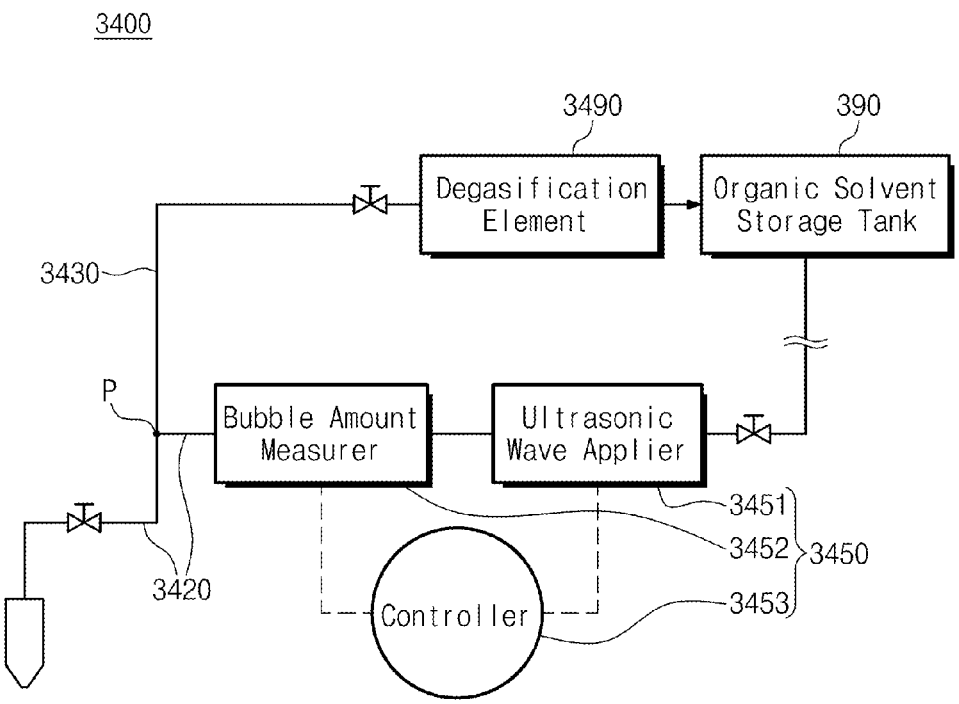
FIG. 13 is a view illustrating a modified example of the organic solvent supplying unit of FIG. 12.

FIG. 13 is a view illustrating a modified example of the organic solvent supplying unit 3300.

Referring to FIG. 13, a bubble providing element 3450 of an organic solvent supplying unit 3400 is provided between a branch point P of a collecting line 3430 and the organic solvent storage tank 390. In this case, the organic solvent supplying unit 3400 further includes a degasification element

3490. The degasification element 3490 is provided on the collecting line 3430. As a liquid organic solvent passes through the bubble providing element 3450, bubbles are generated therein. When being not sprayed to a substrate, the liquid organic solvent is transferred through the collecting line 3430 and then is degasified at the degasification element 3490.

In the described above, the collecting line 3430 is connected to an organic solvent supplying line 3420. However, selectively, the collecting line 3430 may not be provided.

Figure 14:
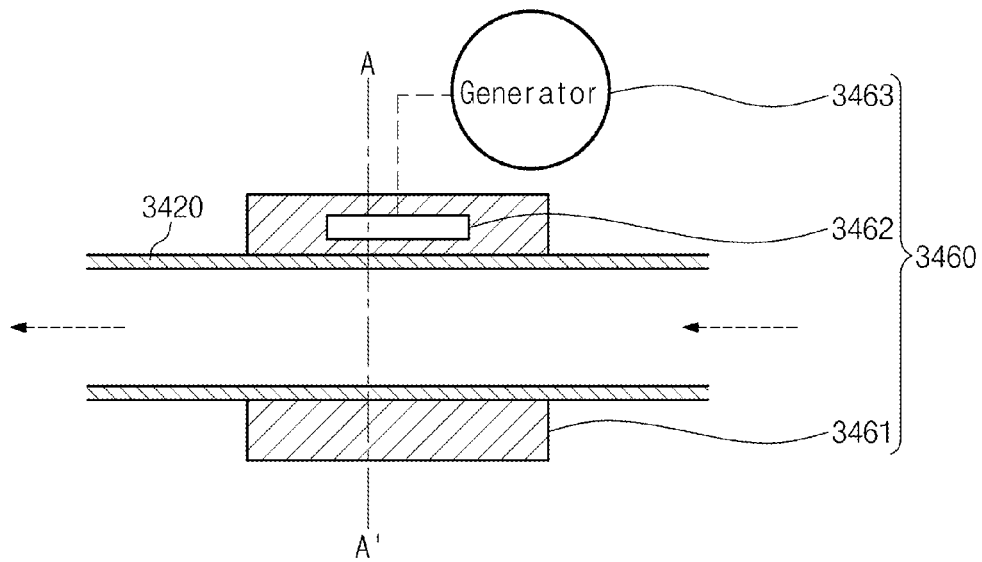
FIG. 14 is a cross-sectional view illustrating an example of an ultrasonic wave applier shown in FIG. 12.
Figure 15:
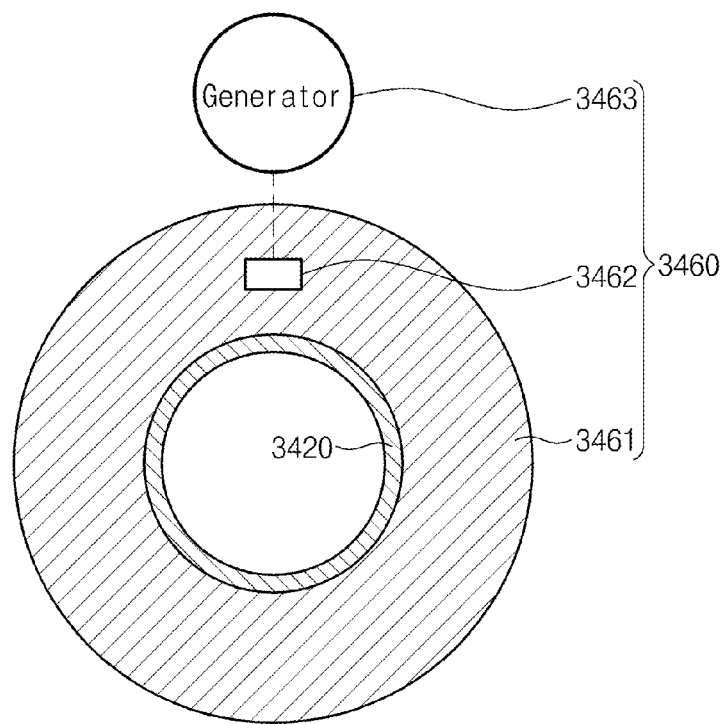
FIG. 15 is a cross-sectional view illustrating the ultrasonic wave applier taken along a line A-A' shown in FIG. 14.

FIG. 14 is a cross-sectional view illustrating an ultrasonic wave applier 3460 according to an embodiment of the present invention. FIG. 15 is a cross-sectional view illustrating the ultrasonic wave applier 3460 taken along a line A-A' shown in FIG. 14.

Referring to FIGS. 14 and 15, the ultrasonic wave applier 3460 includes a body 3461, a vibrator 3462, and a generator 3463. The body 3461 has the shape of a hollow cylinder. The body 3461 is located to surround a part of the organic solvent supplying line 3420. An inner wall of the body 3461 is provided to be in contact with the organic solvent supplying line 3420. Selectively, the body 3461 may have the shape of a curved plate. The vibrator 3462 is located inside a wall forming the body 3461. The vibrator 3462 is electrically connected to the generator 3463. The generator 3463 applies ultrasonic waves to the vibrator 3462. According to an example, the vibrator 3462 may be separated from the organic solvent supplying line 3420 and vibrations of the vibrator 3462 may be transferred to the organic solvent supplying line 3420 through the body 3461. In this case, bubbles are generated in a liquid organic solvent flowing through the organic solvent supplying line 3420.

Figure 16:
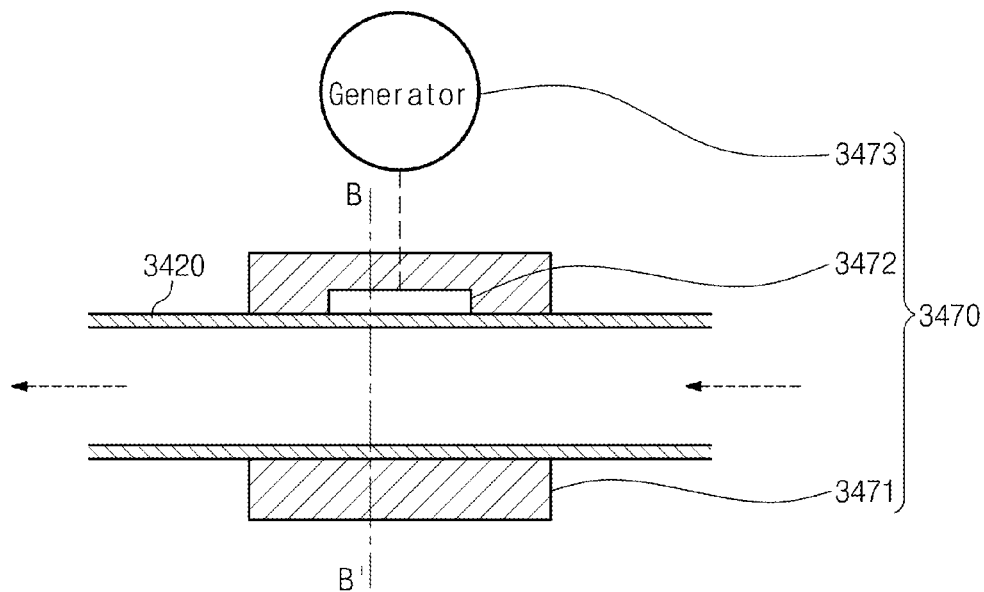
FIG. 16 is a view illustrating a modified example of the ultrasonic wave applier of FIG. 14.
Figure 17:
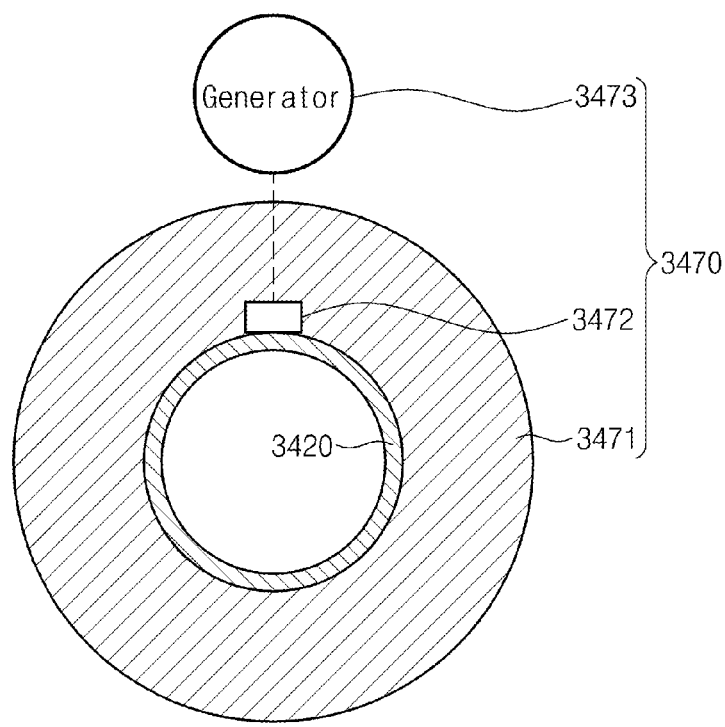
FIG. 17 is a cross-sectional view illustrating the ultrasonic wave applier taken along a line B-B' shown in FIG. 16.

FIG. 16 is a view illustrating a modified example of the ultrasonic wave applier 3460 of FIG. 14. FIG. 17 is a cross-sectional view illustrating an ultrasonic wave applier 3470 taken along a line B-B' shown in FIG. 16.

Referring to FIGS. 16 and 17, the ultrasonic wave applier 3470 includes a body 3471, a vibrator 3472, and a generator 3473. The body 3471 has the shape of a hollow cylinder. The body 3471 is located to surround a part of the organic solvent supplying line 3420. An inner wall of the body 3471 is provided to be in contact with the organic solvent supplying line 3420. Selectively, the body 3471 may have the shape of a curved plate. The vibrator 3472 is located inside a wall forming the body 3471. The vibrator 3472 is provided to apply vibrations to the organic solvent supplying line 3420 while being in direct contact therewith.

Figure 18:
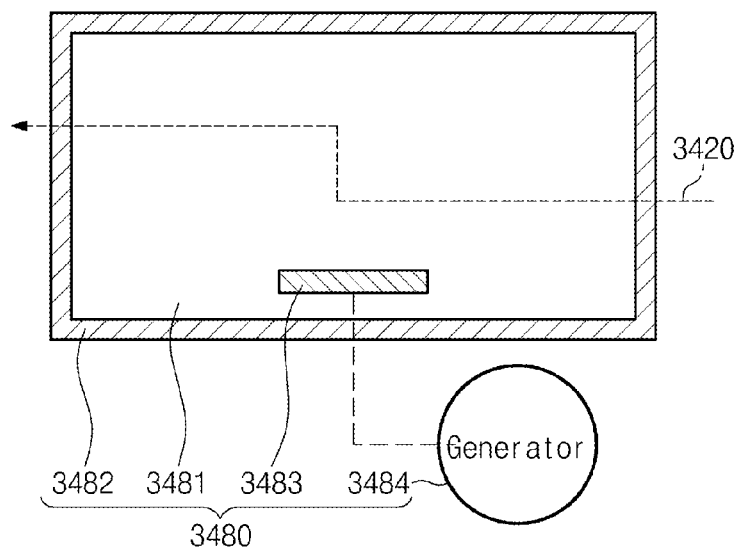
FIG. 18 is a cross-sectional view illustrating another example of the ultrasonic wave applier of FIG. 12.

FIG. 18 is a cross-sectional view illustrating another example of the ultrasonic wave applier 3351 of FIG. 12.

Referring to FIG. 18, an ultrasonic wave applier 3480 includes a container 3482, a vibrator 3483, and a generator 3484. The container 3482 is filled with a fluid medium 3481. The organic solvent supplying line 3420 is provided to pass through the fluid medium 3481 inside the container 3482. The vibrator 3483 is connected to the generator 3484 and be steeped in the fluid medium 3481. When the generator 3484 applies ultrasonic waves to the vibrator 3483, the vibrator 3483 converts the applied ultrasonic waves into vibrations and transfers the vibrations to the fluid medium 3481 inside the container 3482. The fluid medium 3481 to which the vibrations are applied transfers the vibrations to a part of the organic solvent supplying line 3420 steeped in the fluid medium 3481, and the vibrations generate bubbles in a liquid organic solvent. The fluid medium 3481 may be water.

Figure 19:
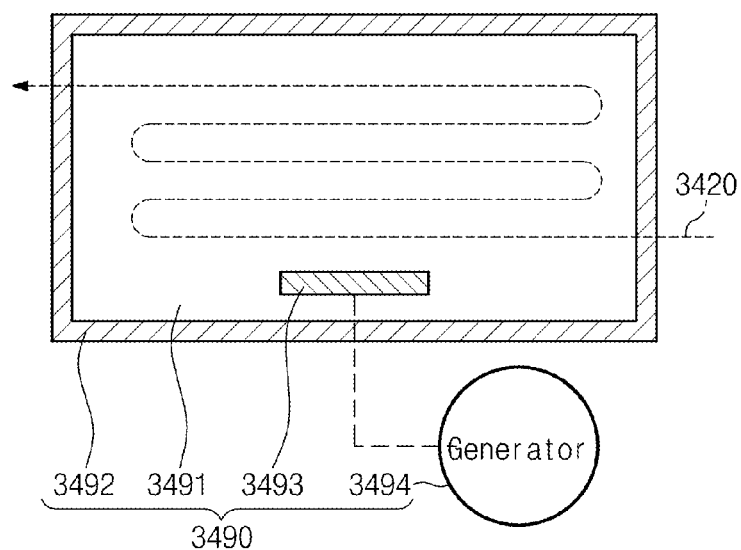
FIG. 19 is a view illustrating a modified example of the ultrasonic wave applier of FIG. 18.

FIG. 19 is a view illustrating a modified example of the ultrasonic wave applier 3480 of FIG. 18.

Referring to FIG. 19, an ultrasonic wave applier 3490 includes a container 3492, a vibrator 3493, and a generator 3494. A length of the organic solvent supplying line 3420 steeped in a fluid medium 3491 inside the container 3492 may be increased. In this case, an area of the organic solvent supplying line 3420 in contact with the fluid medium 3491 is increased, thereby efficiently generating bubbles in a liquid organic solvent.

Hereinafter, a method of cleaning a substrate according to another embodiment of the present invention will be described by using the organic solvent supplying unit 330 of FIG. 12.

Referring to FIG. 12, when a cleaning process is performed on a substrate, a liquid organic solvent is transferred from the organic solvent storage tank 390 through the organic solvent supplying line 3220. When a valve 3322 on the organic solvent supplying line 3320 is closed, the liquid organic solvent is not sprayed to the substrate. Due thereto, the liquid organic solvent does not pass through the bubble providing element 3350 and is not transferred to the nozzle head 3311 but circulates the organic solvent supplying unit 3300. In this case, the liquid organic solvent circulates while being without bubbles. In this case, when a valve 3331 on the collecting line 3330 is opened, the liquid organic solvent is transferred to the organic solvent storage tank 390 through the collecting line 3330.

When pure water remains on the substrate after the cleaning process, the valve 3322 on the organic solvent supplying line 3320 is opened and the valve 3331 on the collecting line 3330 is closed, the liquid organic solvent is transferred to the bubble providing element 3350 using ultrasonic waves, through the organic solvent supplying line 3320. While passing through the bubble providing element 3350 using the ultrasonic waves, the liquid organic solvent receives the ultrasonic waves. Due to the received ultrasonic waves, bubbles are generated in the liquid organic solvent. A method of generating bubbles in a liquid organic solvent by applying ultrasonic waves will be described in detail as follows. The applied ultrasonic waves are controlled by using a method of controlling a frequency of the ultrasonic waves according to an amount of bubbles generated in the liquid organic solvent. The liquid organic solvent with bubbles is transferred to the nozzle head 3311 through the organic solvent supplying line 3320 and is sprayed to the substrate.

The liquid organic solvent with bubbles sprayed to the substrate replaces the pure water remaining on the substrate. A replacement process is performed as the same as the method of cleaning a substrate according to an embodiment of the present invention, and a detailed description thereof will be omitted.

In the method of generating bubbles in the liquid organic solvent by using ultrasonic waves, there are a method of directly applying the ultrasonic waves to the liquid organic solvent and a method of applying the ultrasonic waves by using a fluid medium. As an example, referring to FIGS. 14 and 15, in the method of directly applying the ultrasonic waves, the ultrasonic waves are applied to the organic solvent supplying line 3420 by using the vibrator 3462. The ultrasonic waves applied to the vibrator 3462 are converted into vibrations to be applied to the organic solvent supplying line 3420. Bubbles are generated in the liquid organic solvent due to the applied vibrations.

As another example, referring to FIG. 18, ultrasonic waves are applied to the fluid medium 3481. A part of the organic solvent supplying line 3420 is steeped in the fluid medium 3481 to which the ultrasonic waves are applied. The ultrasonic waves applied to the fluid medium are applied to the organic solvent supplying line 3420. Due to the received ultrasonic waves, bubbles are generated in the liquid organic solvent.

Next, a liquid organic solvent without bubbles is supplied from a nozzle head to a substrate. Referring to FIG. 12, when a liquid organic solvent with bubbles remains on the substrate, the valve 3322 on the organic solvent supplying line 3320 is opened and the valve 3331 on the collecting line 3330 is closed. The liquid organic solvent is transferred to the bubble providing element 3350 using ultrasonic waves, through the organic solvent supplying line 3320. The bubble providing element 3350 is controlled by the controller 3353 not to apply ultrasonic waves to the liquid organic solvent. The liquid organic solvent passing through the bubble providing element 3350 is transferred to the nozzle head 3311 and is sprayed to the substrate while being without bubbles.

The liquid organic solvent without bubbles is mixed with the liquid organic solvent with bubbles remaining on the substrate, thereby removing bubbles.

In the method according to present embodiment described above, the collecting line 3330 is connected to the organic solvent supplying line 3320. However, selectively, the collecting line 3330 may not be provided.

Also, an operation of supplying the liquid organic solvent without bubbles may not be provided.

Figure 20:
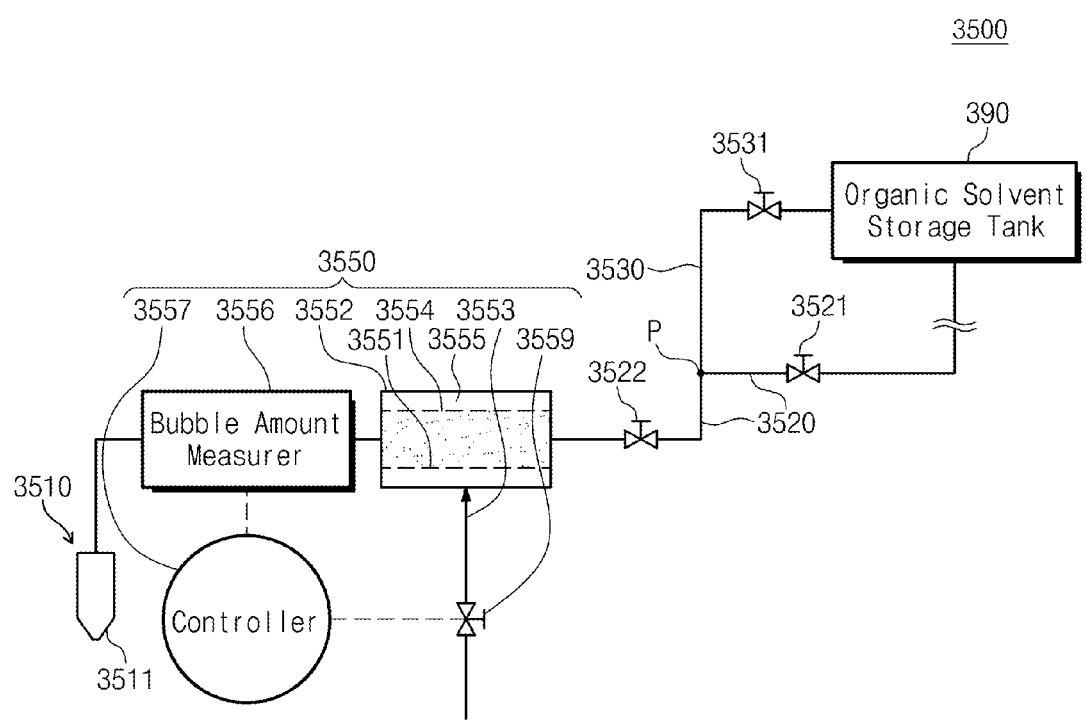
FIG. 20 is a view illustrating an organic solvent supplying unit according to still another embodiment of the present invention.

Hereinafter, an organic solvent supplying unit 3500 according to still another embodiment of the present invention will be described. FIG. 20 is a view illustrating the organic solvent supplying unit 3500 according to still another embodiment of the present invention.

Referring to FIG. 20, the organic solvent supplying unit 3500 includes a nozzle element 3510, an organic solvent supplying line 3520, a collecting line 3530, and a bubble providing element 3550.

The nozzle element 3510, the organic solvent supplying line 3520, and the collecting line 3530 may have similar configurations to those of the nozzle element 3110, the organic solvent supplying line 3120, and the collecting line 3130.

The bubble providing element 3550 includes a membrane line 3551, a housing 3552, a gas supplying line 3553, a bubble amount measurer 3556, and a controller 3557. The membrane line 3551 is provided on the organic solvent supplying line 3520 and is surrounded by the housing 3552. Pores 3554 are formed on the membrane line 3551, through which a gas may be transferred from the outside of the membrane line 3551 to the inside thereof. However, a liquid does not pass through the membrane line 3551. The housing 3552 is provided on the organic solvent supplying line 520 while surrounding the membrane line 3551 and is connected to the gas supplying line 3553. The gas supplying line 3553 is connected to the housing 3552, and a fluid controlling valve 3559 is provided on the gas supplying line 3553. The gas supplying line 3553 transfers as gas to a space 3555 between the membrane line 3351 and the housing 3552. The membrane line 3551 is separated from the housing 3552 to provide the space 3555 having a certain area. In this space 3555, the gas provided through the gas supplying line 3553 flows. The bubble amount measurer 3556 is provided on the organic solvent supplying line 3551 between the membrane line 3551 and a nozzle head 3511. The bubble amount measurer 3556 transfers a result of measuring an amount of bubbles inside the liquid organic solvent to the controller 3557. The controller 3557 controls flux of the gas by using a valve 3559 on the gas supplying line 3553 based on the result of the bubble amount measurer 3556. As an example, the gas may be a nitrogen gas as an inert gas.

Figure 21:
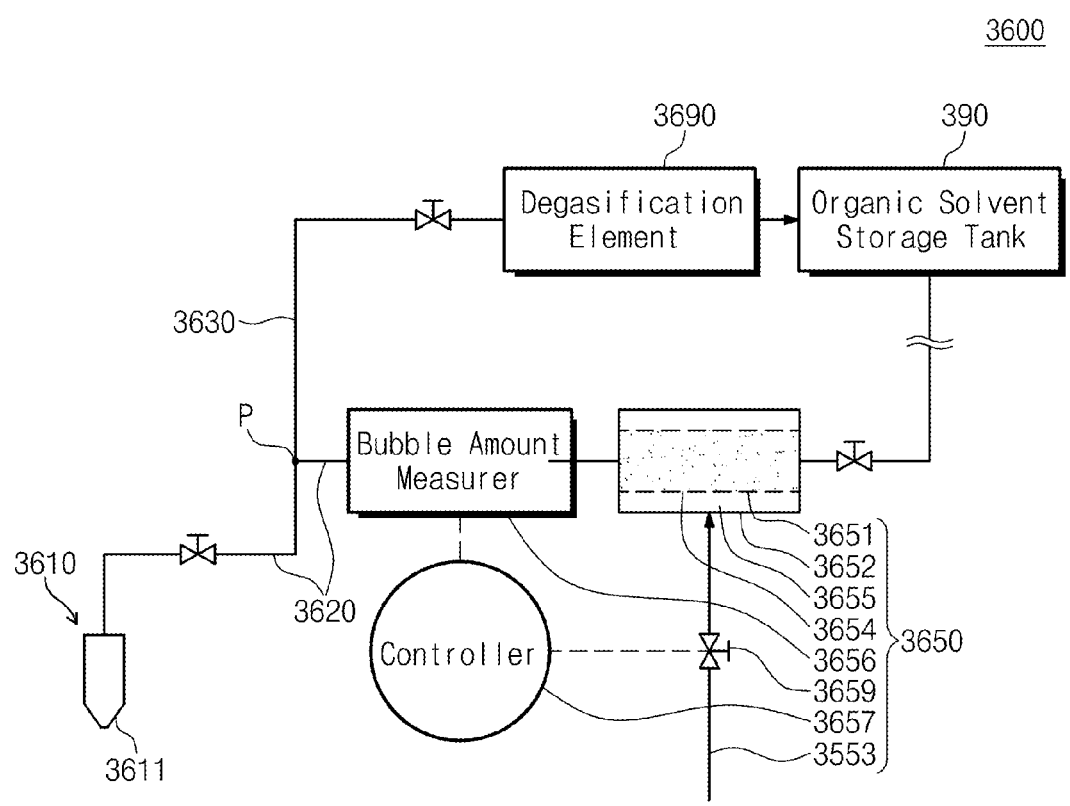
FIG. 21 is a view illustrating a modified example of the organic solvent supplying unit of FIG. 20.

FIG. 21 is a view illustrating a modified example of the organic solvent supplying unit 3500 of FIG. 20.

Referring to FIG. 21, a bubble providing element 3650 of an organic solvent supplying unit 3600 is provided on an organic solvent supplying line 3620 between a branch point P of a collecting line 3630 and the organic solvent storage tank 390. In this case, the organic solvent supplying unit 3600 further includes a degasification element 3690. The degasification element 3690 is provided on the collecting line 3630. As a liquid organic solvent passes through the bubble providing element 3650, bubbles are generated therein. When being not sprayed to a substrate, the liquid organic solvent is transferred through the collecting line 3630 and is degasified at the degasification element 3690.

In the described above, the collecting line 3630 is connected to the organic solvent supplying line 3620. However, selectively, the collecting line 3630 may not be provided.

Hereinafter, a method of cleaning a substrate according to still another embodiment of the present invention will be described by using the organic solvent supplying unit 3500.

Referring to FIG. 20, while a cleaning process is being performed on a substrate, a liquid organic solvent is transferred from the organic solvent storage tank 390 through the organic solvent supplying line 3520. When a valve 3522 on the organic solvent supplying line 3520 is closed, the liquid organic solvent is not sprayed to the substrate.

Due thereto, the liquid organic solvent does not pass through the bubble providing element 3550 and is not transferred to the nozzle head 3511 but circulates the organic solvent supplying unit 3500. In this case, the liquid organic solvent circulates while being without bubbles. In this case, when a valve 3531 on the collecting line 3530 is opened, the liquid organic solvent is transferred to the organic solvent storage tank 390 through the collecting line 3530.

When pure water remains on patterns of the substrate, the valve 3522 on the organic solvent supplying line 3520 is opened and the valve 3531 on the collecting line 3530 is closed. In this case, the liquid organic solvent is transferred to the bubble providing element 3550 through the organic solvent supplying line 3520. As a liquid organic solvent passes through the bubble providing element 3550, bubbles are generated therein. The liquid organic solvent passing through the bubble providing element 3550 is transferred to the nozzle head 3511 and is sprayed to the substrate while being without bubbles. A method of generating bubbles by the bubble providing element 3550 will be described in detail as follows.

Figure 22:
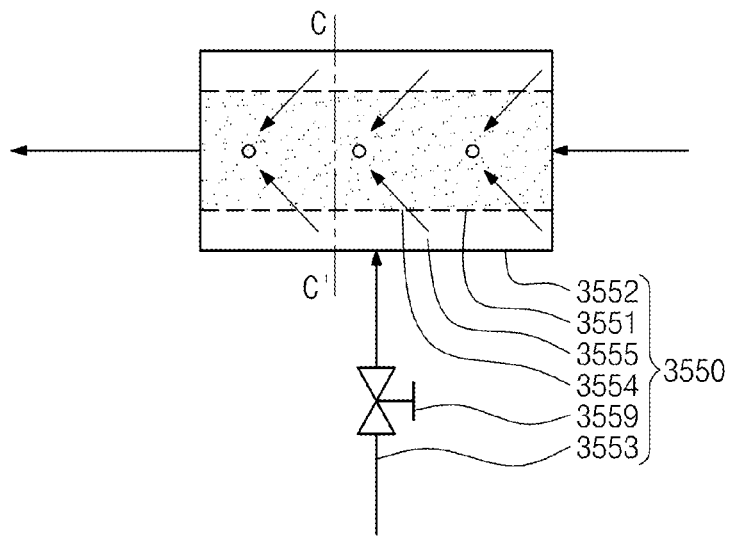
FIG. 22 is a cross-sectional view illustrating a bubble supplying element of FIG. 20.
Figure 23:
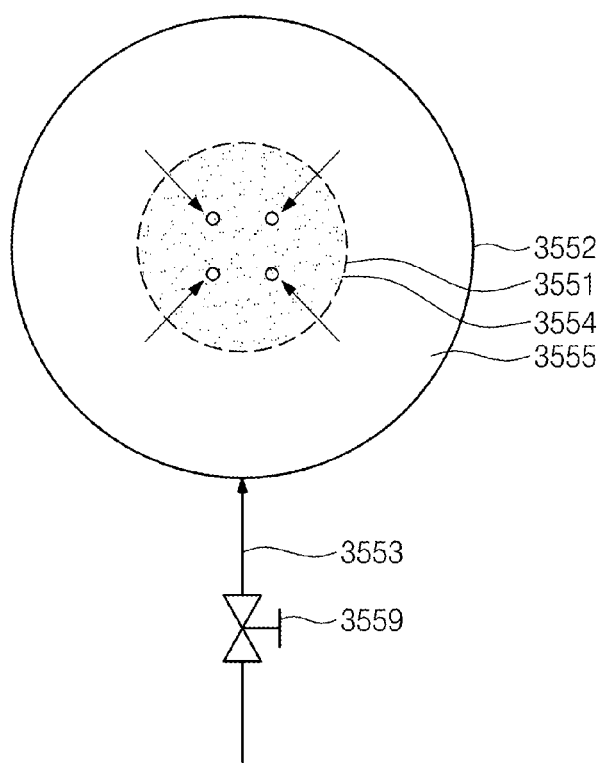
FIG. 23 is a cross-sectional view illustrating the bubble supplying element taken along a line C-C' shown in FIG. 22.

FIG. 22 is a cross-sectional view illustrating the bubble supplying element 3550. FIG. 23 is a cross-sectional view illustrating the bubble supplying element taken 3550 along a line C-C' shown in FIG. 22.

Referring to FIGS. 22 and 23, a gas provided from the bubble providing element 3550 through the gas supplying line 3553 is provided to the space 3555 between the housing 3552 and the membrane line 3551. The gas provided to the space 3555 is transferred from the outside of the membrane line 3551 to the inside thereof via the pores 3554 of the membrane line 3551 due to a difference between pressures of the inside and the outside of the membrane line 3551. The gas inserted from the outside of the membrane line 3551 to the inside thereof flows into a liquid organic solvent passing through the membrane line 3551, thereby generating bubbles in the liquid organic solvent. The controller 3557 controls an amount of the gas flowing into the space 3555 between the housing 3552 and the membrane line 3551. Through this, an amount of the bubbles generated in the liquid organic solvent is controlled.

The liquid organic solvent with bubbles sprayed to the substrate replaces pure water remaining on the substrate. A replacement process is performed as the same as the method of cleaning a substrate according to an embodiment of the present invention, and a detailed description thereof will be omitted.

When the liquid organic solvent with bubbles remains on the substrate, the valve 3522 on the organic solvent supplying line 3520 is opened and the valve 3531 on the collecting line 3530 is closed. The liquid organic solvent is transferred to the bubble providing element 3550 through the organic solvent supplying line 3520. The bubble providing element 3550 is controlled in such a way that the gas does not flow into the space 3555 between the housing 3552 and the membrane line 3551. The liquid organic solvent passing through the bubble providing element 3550 is transferred to the nozzle head 3511 and is sprayed to the substrate while being without bubbles.

The liquid organic solvent without bubbles sprayed to the substrate is mixed with a liquid organic solvent with bubbles remaining on the substrate, thereby removing bubbles. A degasification process is performed as the same as the method of cleaning a substrate according to an embodiment of the present invention, and a detailed description thereof will be omitted.

In the method according to present embodiment described above, the collecting line 3530 is connected to the organic solvent supplying line 3520. However, selectively, the collecting line 3530 may not be provided.

Also, an operation of supplying the liquid organic solvent without bubbles may not be provided.

In the described above, an organic solvent supplying unit includes one of a heater, an ultrasonic wave applier, and a membrane line in a bubble providing element. Differently, an organic solvent supplying unit may include at least two of a heater, an ultrasonic wave applier, and a membrane line in a bubble providing element.

According to the present embodiment, drying efficiency of an apparatus and a method for cleaning a substrate may be improved.

Also, according to the present embodiment, due to bubbles included in a liquid organic solvent, the organic solvent may easily replace pure water, thereby saving the liquid organic solvent used for drying a substrate.

Effects of the present invention are not limited to the described above, and effects not mentioned above will be clearly understood by a person skilled in the art from the specification and the attached drawings.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate cleaning apparatus comprising:
   a substrate supporting unit configured to support a substrate;
   a container surrounding the substrate supporting unit and configured to collect a liquid organic solvent scattered from the substrate; and
   a fluid supplying unit provided on one side of the container and configured to spray the liquid organic solvent with bubbles to the substrate, the fluid supplying unit including,
      a nozzle head configured to eject the liquid organic solvent to the substrate;
      an organic solvent supplying line configured to supply the liquid organic solvent from an organic solvent storage tank to the nozzle head; and
      a bubble providing element provided on the organic solvent supplying line and configured to provide bubbles to the liquid organic solvent, the bubble providing element including,
         a heater provided on the organic solvent supplying line and configured to heat the liquid organic solvent to at least a boiling point temperature such that bubbles are formed in the liquid organic solvent.

2. The apparatus of claim 1, wherein the bubble providing element includes,
   a controller configured to control a temperature of the heater,
   wherein the controller is configured to control the heater to heat the liquid organic solvent to a temperature of a boiling point or higher.

3. The apparatus of claim 2, wherein the fluid supplying unit further comprises a detour line provided on the organic solvent supplying line to make a detour around the heater.

4. The apparatus of claim 2, wherein isopropyl alcohol is provided as the organic solvent, and
   wherein the controller controls the heater to heat the isopropyl alcohol to a temperature from 80° C. to 100° C.

5. The apparatus of claim 1, wherein the bubble providing element comprises an ultrasonic wave applier applying ultrasonic waves to the liquid organic solvent flowing through the organic solvent supplying line.

6. The apparatus of claim 5, wherein the ultrasonic wave applier comprises:
   a vibration device provided on the organic solvent supplying line; and
   a generator providing the ultrasonic waves to the vibration device.

7. The apparatus of claim 6, wherein the ultrasonic wave applier further comprises:
   a bubble amount measurer provided between the vibration device and the nozzle head and measuring an amount of the bubbles included in the liquid organic solvent; and
   a controller controlling a frequency of the ultrasonic waves applied to the vibration device.

8. The apparatus of claim 7, wherein the vibration device comprises:
   a body in contact with the organic solvent supplying line and surrounding the organic solvent supplying line; and
   a vibrator provided inside the body, receiving the ultrasonic waves, and applying the received ultrasonic waves to the organic solvent supplying line.

9. The apparatus of claim 5, wherein the ultrasonic wave applier comprises:
   a container filled with a fluid medium;
   a vibrator applying vibrations to the fluid medium inside the container; and
   a generator applying ultrasonic waves to the vibrator,
   wherein a part of the organic solvent supplying line is steeped in the fluid medium inside the container.

10. The apparatus of claim 1, wherein the bubble providing element includes,
   a membrane line connected to the organic solvent supplying line, in which the liquid organic solvent flows, the membrane line formed with pores;
   a housing surrounding the membrane line; and
   a gas supplying line supplying a gas to a space between the membrane line and the housing, wherein the gas supplied to the space is inserted into the membrane line via the pores, thereby providing bubbles to the liquid organic solvent.

11. The apparatus of claim 10, wherein the bubble providing element further includes,
   a bubble amount measurer measuring an amount of the bubbles included in the liquid organic solvent;
   a flux control valve installed on the gas supplying line and controlling flux of the gas supplied to the space; and
   a controller controlling the flux control valve according to a result of being measured by the bubble amount measurer.

12. The apparatus of claim 1, wherein the fluid supplying unit further includes a circulation line branching off from the organic solvent supplying line, connected to the organic solvent storage tank, and transferring the liquid organic solvent to the organic solvent storage tank.

13. The apparatus of claim 12, wherein the bubble providing element is provided on the organic solvent supplying line between a branch point of the circulation line and the nozzle head.

14. The apparatus of claim 13, wherein the fluid supplying unit further includes a degasification element provided on the circulation line and separating bubbles from the circulating liquid organic solvent, and
   wherein the bubble providing element is provided on the organic solvent supplying line between the branch point of the circulation line and the organic solvent storage tank.

15. The apparatus of claim 12, wherein the fluid supplying unit further includes a nozzle arm connected to the nozzle head, and
   wherein the bubble providing element is provided inside the nozzle arm.

* * * * *